United States Patent [19]
Hinkle et al.

[11] Patent Number: 5,703,416
[45] Date of Patent: Dec. 30, 1997

[54] ELECTROMAGNETIC COMPATIBILITY FOR INTEGRATED CIRCUIT PINS AND INTERNAL NODES

[75] Inventors: Stephen C. Hinkle, Gilbert; Richard Hull, Chandler, both of Ariz.

[73] Assignee: Microchip Technology Incorporated, Chandler, Ariz.

[21] Appl. No.: 606,277

[22] Filed: Feb. 23, 1996

[51] Int. Cl.⁶ .................................................. H03B 1/00
[52] U.S. Cl. ........................... 307/89; 327/551; 327/311
[58] Field of Search ............................... 307/89–91, 104; 327/31, 34, 206, 551–559, 310, 311, 362; 361/56, 111

[56] References Cited

U.S. PATENT DOCUMENTS

| | | | |
|---|---|---|---|
| 4,596,939 | 6/1986 | Yamada | 327/34 |
| 5,113,098 | 5/1992 | Teymouri | 327/552 |
| 5,341,033 | 8/1994 | Koker | 327/310 |
| 5,563,532 | 10/1996 | Wu et al. | 327/34 |

*Primary Examiner*—Richard T. Elms
*Attorney, Agent, or Firm*—Wigman, Cohen, Leitner & Myers, P.C.

[57] ABSTRACT

A circuit for providing protection from effects of electromagnetic interference (EMI) at input pins and internal nodes of an integrated circuit (IC) includes a regenerative comparator (Schmitt trigger) to perform triggering functions in response to input pulses applied to the input pin, resulting in hysteresis between high and low trigger voltages. The hysteresis extends durations of false pulses induced by presence of EMI at the input pin. A filter is coupled to the regenerative comparator, with a filter response time with a duration at least as great as the expected largest duration of EMI-induced false pulses including extended duration attributable to the hysteresis, for filtering out the EMI-induced false pulses. A pulse generator is coupled to the filter, for generating a pulse for application to the IC whenever a pulse applied to the input pin has a duration exceeding the duration of the filter time constant. The filter circuit also includes apparatus for changing a logic state of EMI-sensitive internal nodes of the IC which have relatively high RC time constants, are at a logic "1" state, and are in signal paths of the IC which determine operation of the IC, and converting the logic "1" state to a logic "0" state whenever EMI is present in the IC. The EMI-sensitive internal nodes of the IC electrically isolates the internal nodes, e.g., to inhibit them from discharging in the presence of EMI in the IC. The electrical isolation is provided by a resistor or a diode coupled between an internal node and a point of electrical ground reference. The internal nodes are EMI sensitive, each having a relatively high RC time constant for charging to a predetermined voltage level representing a logic value, located in a signal path of the IC enabled by IC circuit conditions to determine IC operation, and normally held at a logic "1" value during IC operation. When EMI detected in the IC, the logic value of the nodes is changed to logic "0".

18 Claims, 8 Drawing Sheets

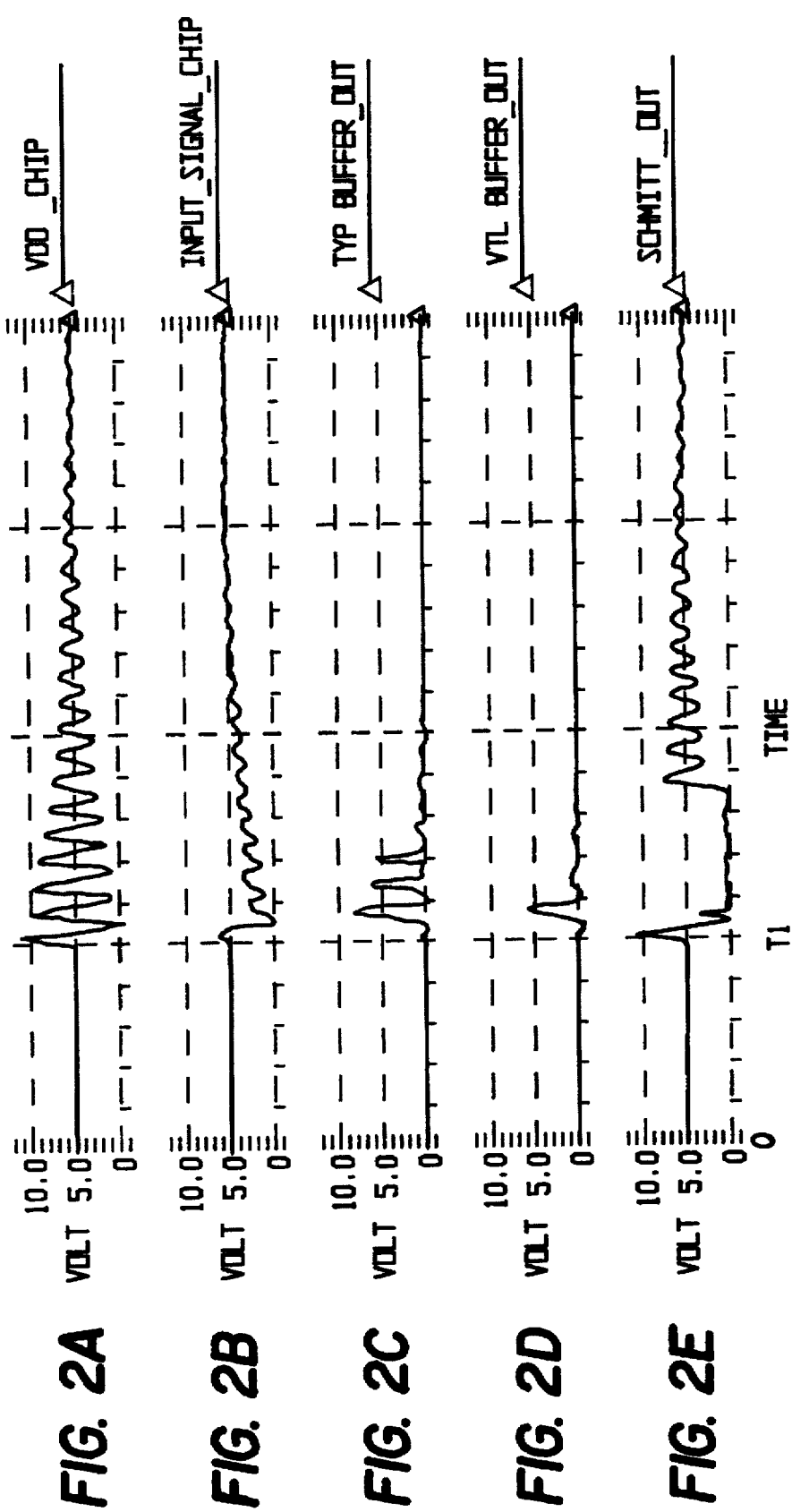

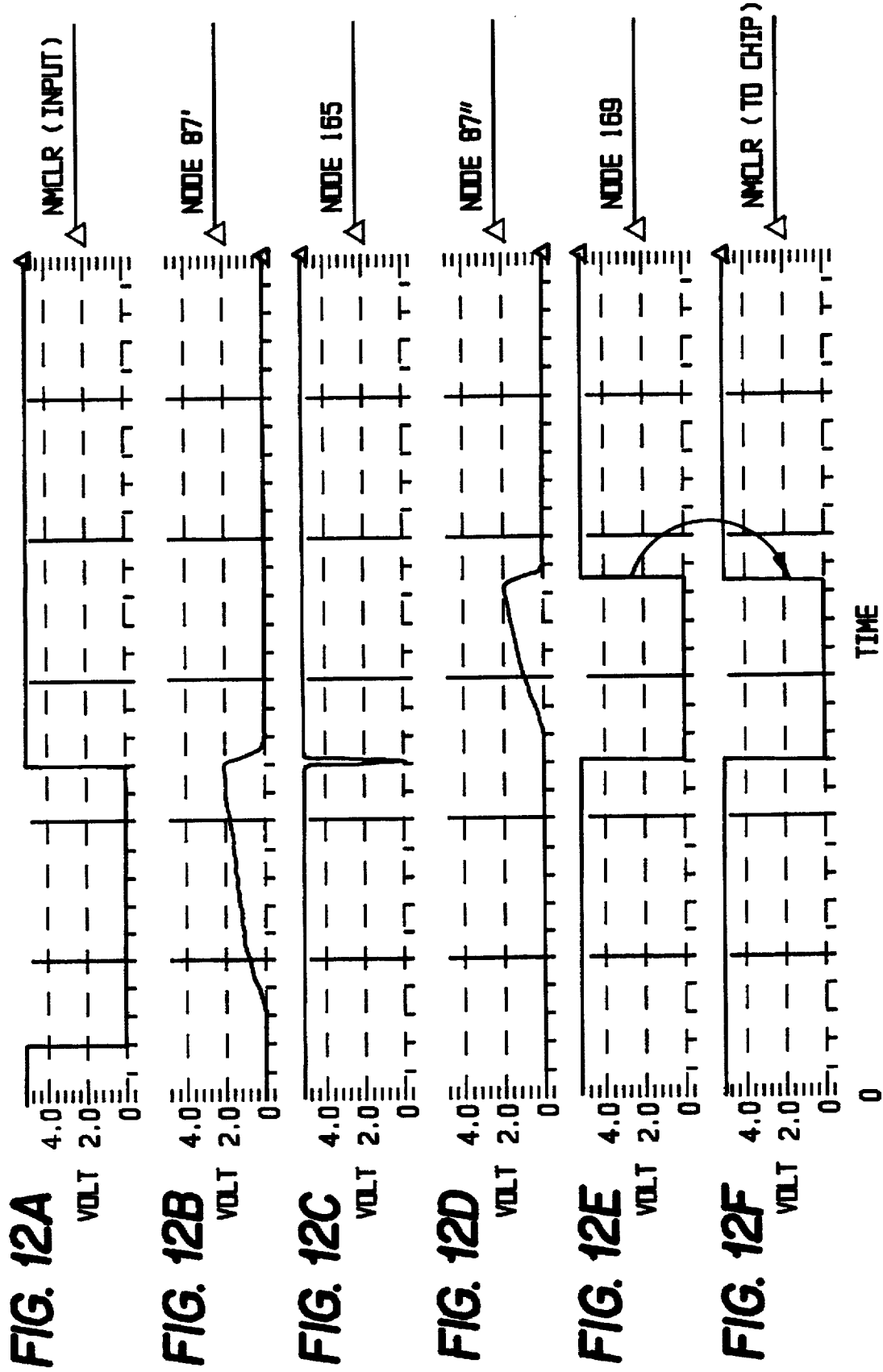

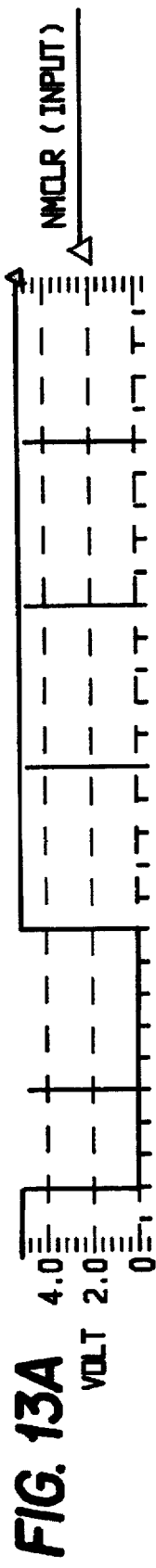
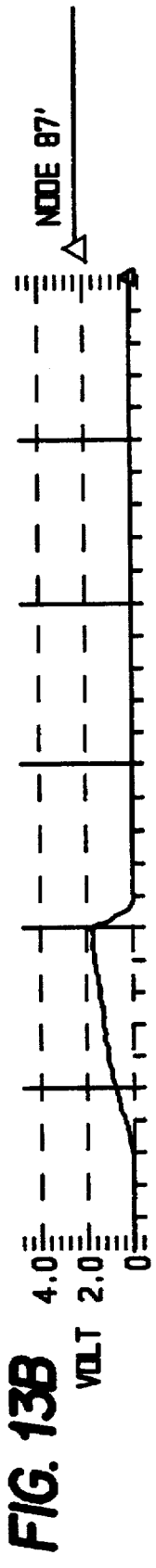
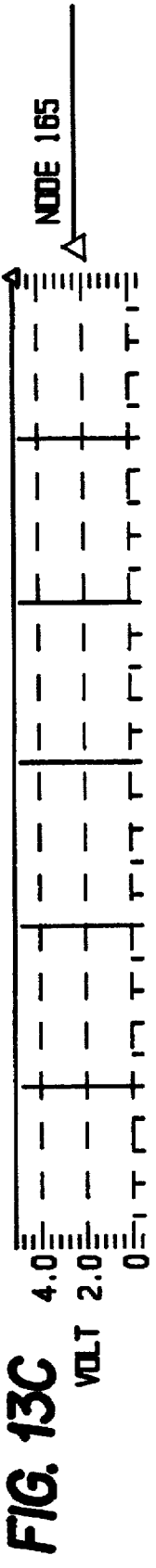
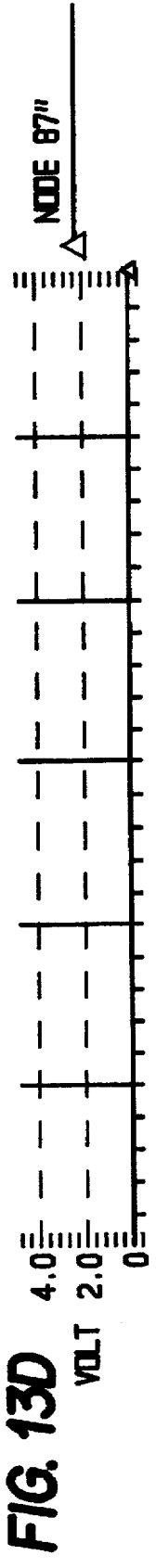
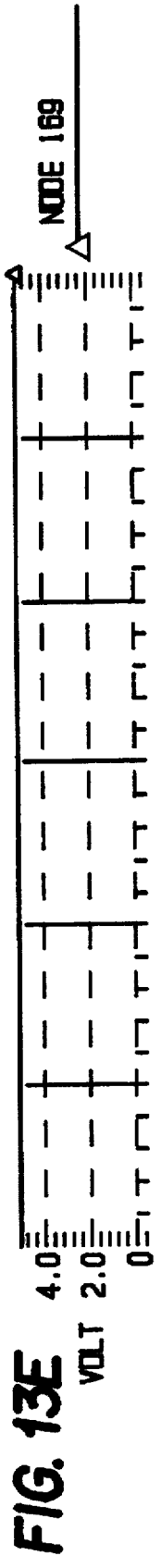
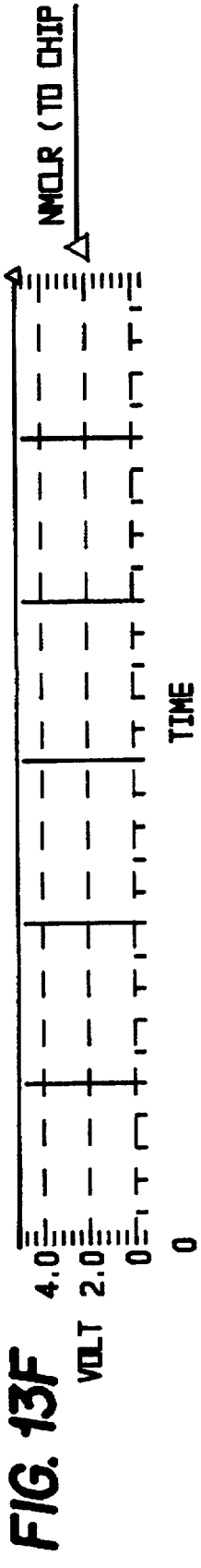
FIG. 13A
FIG. 13B
FIG. 13C
FIG. 13D
FIG. 13E
FIG. 13F

ELECTROMAGNETIC COMPATIBILITY FOR INTEGRATED CIRCUIT PINS AND INTERNAL NODES

BACKGROUND OF THE INVENTION

The present invention relates generally to electromagnetic compatibility between electronic circuits, and, more particularly, to improvements by which to provide electromagnetic compatibility for input pins and internal nodes of an integrated circuit.

Electromagnetic compatibility (EMC) may be defined as the ability of an integrated circuit (IC), device or any system (collectively referred to herein as "system") to operate according to its designed specifications in a predetermined environment without introducing electromagnetic interference (EMI) internally or with any other system within the environment. Elimination of EMI in such situations is important because the interference may induce false signals within the system responsible for the interference or in some other system within the vicinity of the responsible system, which can cause either or both to operate in an improper manner.

EMC within an environment may be analyzed with respect to three main areas. The first of these is the compatibility of the system with its internal elements, attributable to its own operation. The second is the compatibility (or lack thereof) of the system with the environment, owing to the extent of EMI generated by the system which is injected into its environment. The third area of analysis is the compatibility (or lack thereof) of the environment with the system, owing to the extent of EMI generated within the environment which is injected into the system. The present invention focuses on this third area—that is, on the immunity of a system to EMI injected into it from, in this respect, the hostile environment in which it is designed or intended to operate—but it will be understood that the concepts presented herein may be useful for the other areas as well.

One type of electromagnetic interference that can cause false signals to be evoked within an IC from the environment, is electrostatic discharge (ESD). For example, ESD can be introduced into an IC when contacted, whether directly or indirectly, by a person who has just walked across a room, or when subjected to noise generated by other ICs, systems, or equipment within the environment. ESD interference, and electromagnetic interference in general, typically have an adverse effect on the performance of an IC in two ways. First, false input voltage levels may be induced on the input pins of the IC during the EMI event, which can cause the IC to respond—inappropriately—to the false signals. Second, internal nodes of the IC may be sensitive to the EMI event and fail to respond to it with sufficient speed, so that false logic levels are induced at the nodes.

Various techniques have been proposed in the past to eliminate or reduce the effects of extraneous signals or electrical interference on ICs and electronic systems. By way of example, U.S. Pat. No. 5,113,098 to Teymouri describes a "glitch remover" circuit for eliminating noise spikes from control signals that are received at a small computer systems interface (SCSI) bus. The '098 patent glitch remover circuit includes an input buffer and a filter. The input buffer is a Schmitt trigger with hysteresis to remove the effects of the spikes around its threshold switching point, to provide a pulsed output voltage. The filter responds to the pulsed output voltage to pass a filtered pulse signal at an output terminal, but only when the pulses of the Schmitt trigger's output voltage have a width greater than a predetermined time interval. Thus, although this technique may remove or reduce noise glitches on a bus, it does not offer electromagnetic interference protection generally, or protect the internal nodes of a circuit from EMI.

It is a principal object of the present invention to provide techniques and methods for improving the electromagnetic compatibility for both the input pins and the internal nodes of an IC by which to render the circuit immune to electromagnetic interference.

SUMMARY OF THE INVENTION

The present invention provides EMC in which input pins of the IC are protected from EMI by first determining the width (duration) of a false pulse induced by an EMI event, and then filtering the false pulses out by setting the filter time according to the duration of each such pulse. At the same time, the invention protects internal nodes of the IC from EMI by inclusion of an isolation element such as a resistor or a diode between the internal node to be protected and an associated pull-up device, to inhibit discharge of the node on occurrence of the EMI event, or, alternatively, by forcing EMI-sensitive internal nodes to be held at a logic level or state of "0", rather than "1", during an EMI event.

BRIEF DESCRIPTION OF THE DRAWINGS

The above and other objects, features, aspects, and attendant advantages of the invention will become apparent from a consideration of the following detailed description of certain preferred embodiments and methods which represent the presently contemplated best mode of practicing the invention, especially when taken in conjunction with the accompanying drawings, in which:

FIGS. 2A, B, C, D, and E are graphs of signals at various points in the IC of FIG. 1;

FIGS. 12A, B, C, D, E and F; and FIGS. 13A, B, C, D, E and F are graphs showing signals appearing at various points in the circuit of FIG. 10 for different input pulse widths.

DETAILED DESCRIPTION OF THE PREFERRED EMBODIMENTS AND METHODS

Generally, ICs are susceptible to electromagnetic interference in two ways. First, upon occurrence of an EMI event, fluctuations typically occur in the power supply voltage. These fluctuations can range in amplitude from ground reference level to more than twice the power supply voltage level. Furthermore, because of induced delay between an input signal and the power supply voltage fluctuations attributable to package resistance, inductance and capacitance parasitics, one or more input pins of the IC may exhibit a false input level or pulse during the EMI event. If that occurs, the false voltage level at the input pin is likely to cause a false response by the IC. Second, various integral nodes within the IC may be sensitive to EMI. If those nodes fail to respond rapidly to an EMI event, a false logic level may be induced at the respective node. To provide adequate immunity from electromagnetic interference, techniques and methods must be devised to counteract the effects of EMI that occur at both the input pins and internal nodes of the IC.

I. Protection of Input Signals from EMI

Figure 1:
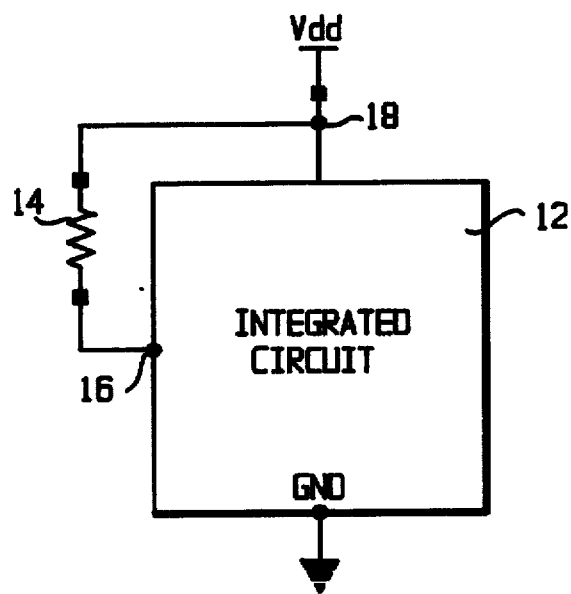
FIG. 1 is a simple IC diagram useful for describing the effect of EMI on an input pin.

Referring now to FIG. 1, the effects of EMI on an input pin 16 of IC 12 will be explained. Input pin 16 is coupled through external resistor 14 to a first supply voltage terminal 18 at which operating potential $V_{DD}$ is applied, to provide a constant logic "1" at input pin 16. However, during an EMI event, charge is injected into IC 12 which causes operating potential $V_{DD}$ to fluctuate, and thereby results in fluctuation of the input signal appearing at input pin 16.

FIGS. 2A, B, C, D and E graphically illustrate various signals in IC 12. These signals include the effects of package parasitics such as parasitic resistances, inductances and capacitances associated with the package lead frame, bonding wire and silicon parasitics. FIG. 2A illustrates a typical operating voltage $V_{DD}$ applied to IC 12 under the influence of an EMI event that begins at time T1. In these circumstances, the desired operating potential of 5 volts may vary between 0 and 10 volts. In FIG. 2B, the effect of this fluctuating operating potential has caused the signal appearing at input pin 16 to correspondingly vary between about 5 volts and 0 volts. The voltage level at input pin 16 is no longer held at the operating voltage $V_{DD}$ because the voltage appearing at the input pin cannot track the high voltage and frequency characteristics of the varying power supply voltage caused by the EMI event. Thus, input pin 16 is no longer held at an intended logic "1", and, if left uncorrected, the IC 12 will improperly respond to this logic change.

Figure 3:
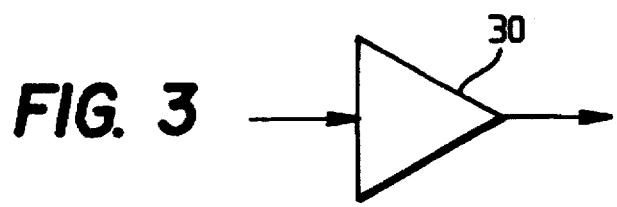
FIG. 3 is a simplified block diagram of an input buffer integral to the IC of FIG. 1, with a switching logic threshold of $V_{DD}/2$.

FIG. 3 shows a typical input buffer 30 which is internal to IC 12 and coupled to input pin 16, so that the buffer has a switching logic threshold of $V_{DD}/2$. The output signal of buffer 30 resulting from its response to the input signal of FIG. 2B, is shown in FIG. 2C. The buffer output, which was intended to be a logic "0", contains several voltage spikes indicative of a logic high voltage level because the signal appearing at input pin 16 is no longer stable at 5 volts (a logic "1"). Accordingly, input buffer 30 would likely produce numerous false input pulses to the IC as a result of an EMI event.

Additionally, even if the switching threshold of the input buffer 30 was lowered by adjusting the sizes of internal PMOS and NMOS transistors (not shown) typically incorporated in such a buffer, fluctuations are still likely to occur to produce false input pulses as illustrated in FIG. 2D.

Figure 4:
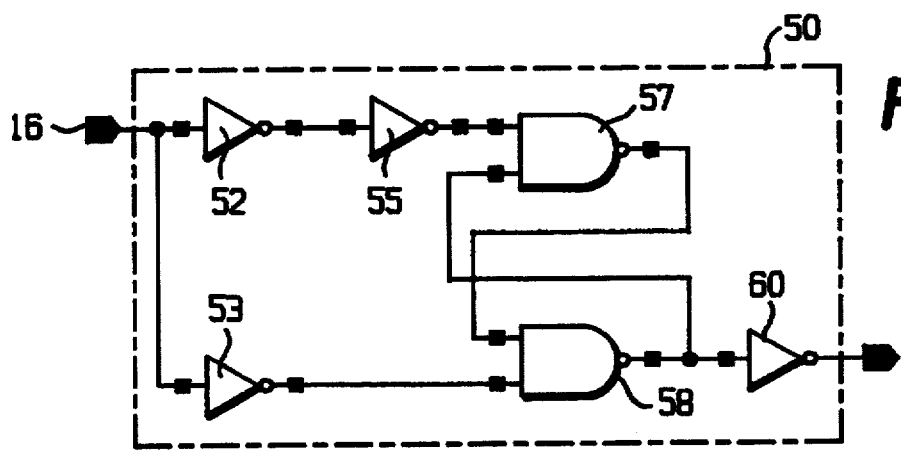
FIG. 4 is a diagram of a Schmitt trigger useful in relation to effects of an EMI event at an input pin of the IC of FIG. 1.

A Schmitt Trigger (ST) (also known as a regenerative comparator) 50 is shown in FIG. 4. The ST includes buffers 52 and 53, having their input terminals coupled in parallel to receive an input signal at pin 16. The output of buffer 52 is fed through an inverter 55. The outputs of inverter 55 and buffer 53 are applied to a set/reset (S/R) latch which includes NAND gates 57 and 58. The output of the S/R latch is applied as the input to an inverter 60, which provides the output signal of the trigger circuit.

ST 50 enables isolation of upper and lower input threshold switching voltages ($Vt_h$ and $Vt_l$, respectively), set by buffers 53 and 52, respectively, which causes the circuit to exhibit a phenomenon known as hysteresis, or backlash, representing the difference between the two voltage levels. Because of hysteresis, the ST triggers at a higher voltage for increasing than for decreasing signals. If the trigger circuit is driven by the input signal depicted in FIG. 2B, its output state will undergo a change whenever the level of that input signal falls below $Vt_l$. However, the hysteresis prevents the ST from changing back to its original state until the voltage level of the input signal exceeds $Vt_h$. Typically, the latter event will not occur until the input signal level reach a value which is a significantly high percentage of the operating voltage $V_{DD}$. Although this has a positive effect of filtering much of the small voltage fluctuation on the input attributable to a fluctuating voltage supply, if the input signal level fails to reach $Vt_t$ in one or more fluctuations the ST will actually increase the width of a false pulse which appears at its output—as illustrated in the graph of FIG. 2E. Hence, while a predetermined mount of hysteresis has the desirable effect of rejecting noise on input control signals, in the case where an EMI event is taking place the hysteresis has an undesirable effect of increasing the duration of false input pulses.

According to an aspect of the present invention, recognition is given to the fact that if the input pin of an IC is designed to have hysteresis, the factors that produce this hysteresis are to be taken into account in the simulation and analysis of the amount of filtering that will be required to protect the IC (e.g., IC 12) from the extended duration false pulses attributable to EMI. That is, the false pulses must be filtered out, and by knowing the mount of hysteresis involved, the induced extended duration EMI pulses can be predicted and simulated so that the mount of filtering required to eliminate or substantially reduce the effect of the EMI pulses may be calculated to render the input pin(s) immune to the effects of an EMI event. The filter characteristics should be chosen to minimize the filter time constant, to preclude degradation of overall system performance that would occur if input signals were required to have excessively long pulse widths, while at the same time, to enable the filter to substantially eliminate minimum duration pulses induced from EMI and extended as a result of hysteresis.

II. Protection of Internal Nodes from EMI

Figure 5:
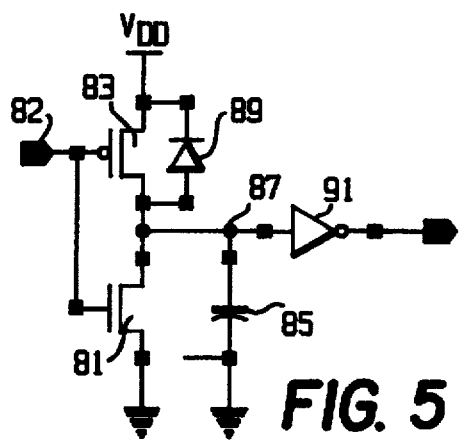
FIG. 5 is a schematic circuit diagram of means by which an internal node of the IC may be held at a particular logic level.

Since EMI may also have a deleterious effect on internal nodes within an IC which contributes to improper operation of the IC, another aspect of the invention provides that the sensitivity of the integral nodes to EMI may be characterized by an internal node which is intended to be held at a logic "1" through a pull-up element containing a parasitic diode referenced to $V_{DD}$. Referring for example to FIG. 5, a circuit for holding an internal node 87 at a logic "1" includes an input transistor 81, a pull-up device/PMOS transistor 83, and a capacitor 85. Here, PMOS transistor 83 has a parasitic drain to N-well diode 89.

Initially, transistor 81 is rendered inoperative via the signal applied at node 82, and capacitor 85 is charged via transistor 83 and voltage $V_{DD}$. Accordingly, internal circuit node 87 is held at a logic "1". When EMI is injected into the system, operating voltage $V_{DD}$ commences oscillation with both positive and negative going transitions, as illustrated in FIG. 2A. If $V_{DD}$ falls one diode voltage below the voltage level stored on capacitor 85, the parasitic diode 89 will become forward biased and provide a low impedance path for rapidly discharging capacitor 85, and hence, change node 87 from its initial condition of a logic "1". On the following low-to-high transition edge of voltage $V_{DD}$, the parasitic diode again becomes reverse biased and turns off. But this establishes a race condition between the capacitor trying to recharge, and thus restore node 87 to its initial logic "1" state, through PMOS transistor 83 and the rising edge of voltage $V_{DD}$ which is attempting to re-establish the input threshold of the next stage, shown as inverter 91 in FIG. 5. If the fluctuating voltage $V_{DD}$ rises faster than the charging of capacitor 85 through PMOS transistor 83, inverter 91 will erroneously detect a logic "0" (a false logic state) until the voltage on the capacitor exceeds the threshold voltage of the inverter.

Figure 6:
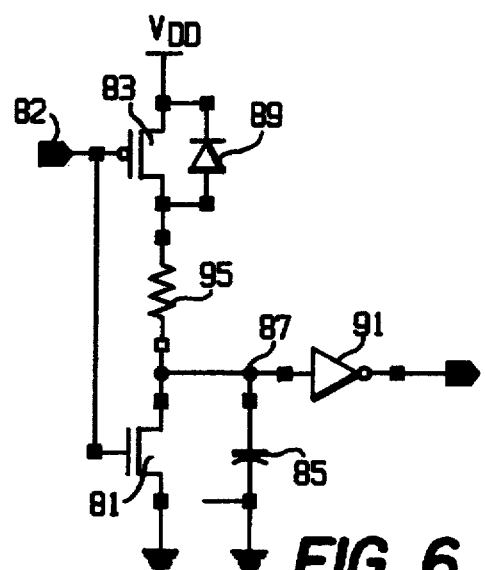
FIG. 6 corresponds to FIG. 5, with a resistor used as an isolation element.

To alleviate such false logic signals at internal nodes, the present invention employs two alternative approaches. One approach is to introduce an isolation element between the capacitor and the parasitic diode to block or slow the discharge of capacitor 85 on the negative edge of $V_{DD}$. In FIG. 6, the isolation element is a resistor 95 which is effective to slow the discharge of the capacitor on the negative transition of $V_{DD}$. On the rising edge of $V_{DD}$, however, the isolation resistor is merely part of the charging resistance (necessitating that the sizing of PMOS transistor 83 be adjusted to accommodate the added resistance).

Figure 7:
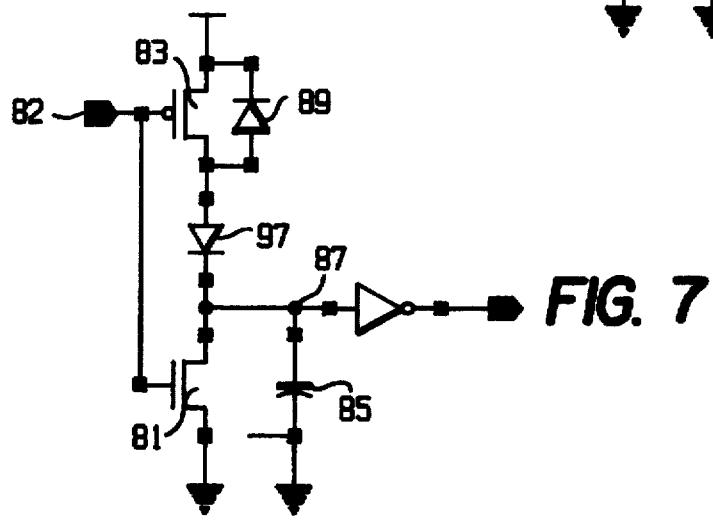
FIG. 7 is similar to FIG. 6, but with a diode used as the isolation element.

In the circuit of FIG. 7, the isolation element is a diode 97 which is effective to block the discharge of the capacitor on the negative transition of $V_{DD}$ (because the diode is then reverse biased). However, on the positive transition of $V_{DD}$, the diode will provide a low impedance charging path between transistor 83 and capacitor 85 so that the logic "1" state will be limited to a maximum voltage of $V_{DD}$ less the voltage drop across diode 97.

According to the invention, a second, alternative approach for eliminating or reducing the effect of false logic signals at internal nodes is to provide a circuit in which those internal nodes that are EMI-sensitive are held at logic "0" (rather than a logic "1") during the time when circuit conditions would otherwise allow the sensitive nodes to propagate a false signal which causes a system error. A sensitive node is defined for purposes of the invention as a node which has a relatively high RC time constant, is held at a logic "1" value, and is in a signal path that is enabled by circuit conditions to determine the chip (IC) operation.

Figure 8:
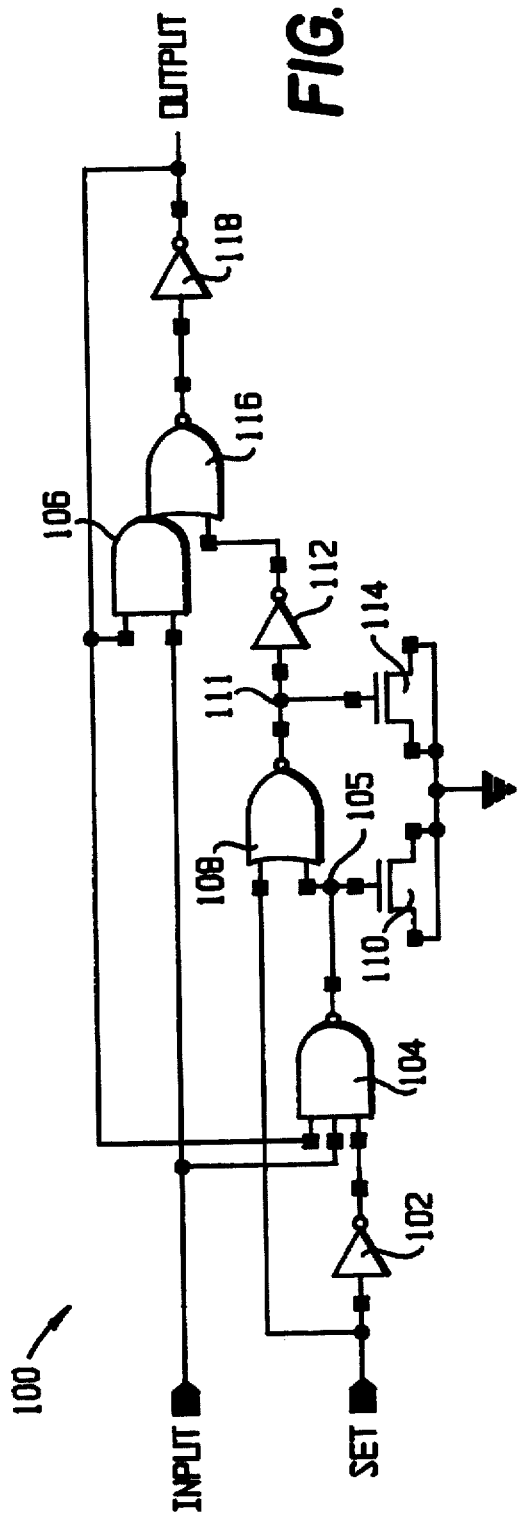
FIG. 8 is a detailed schematic diagram of a one-shot circuit.
Figure 9:
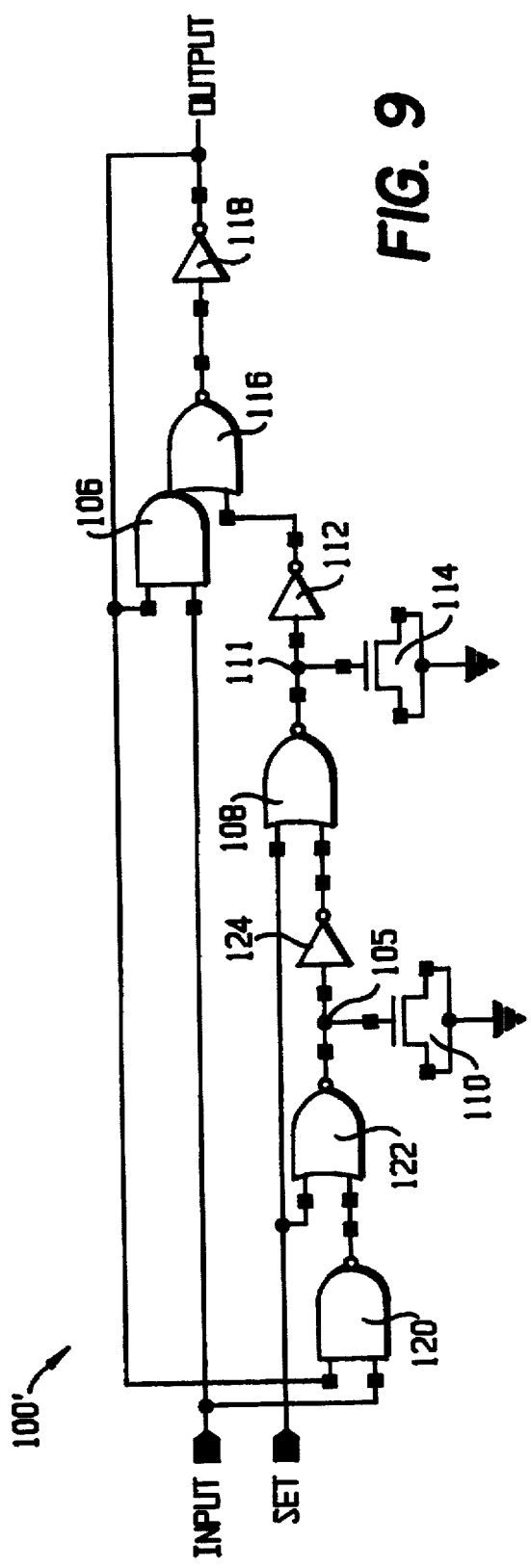
FIG. 9 is a diagram similar FIG. 8, but modified to render integral nodes of the one-shot circuit insensitive to EMI.

To clarify this second approach, reference is made to FIGS. 8 and 9. In FIG. 8, a one-shot circuit 100 includes an inverter 102 having an input coupled to a set input of the one shot circuit and an output coupled to an input terminal of a NAND gate 104. An input of circuit 100 is also applied to another input terminal of NAND gate 104 and to an input of an AND gate 106. The output of circuit 100 is fed back as inputs to another terminal of AND gate 106 and yet another terminal of NAND gate 104. The output of NAND gate 104 is coupled to an integral node 105 of the IC which is coupled to an input of NOR gate 108 and returned to ground through a capacitor 110. The set input to circuit 100 is coupled to a second input of NOR gate 108, the output of which is coupled to another internal node 111. The latter is coupled to an input of inverter 112 and returned to ground through a capacitor 114. The outputs of AND gate 106 and inverter 112 are respectively coupled to first and second inputs of NOR gate 116, which has an output applied as an input to inverter 118. The output of the latter is the output signal of one-shot circuit 100.

In operation, the initial state of the output of one-shot circuit 100 is at a logic "1" which is forced by having a logic "1" at either of the two inputs of NOR gate 116. When the output of inverter 112 is at a logic "1", the input of the one-shot circuit is at a logic "0" and the set input is held at a logic "0". A corresponding logic "1" appears at integral circuit node 105 (across capacitor 110), while a logic "0" appears at circuit node 111 (across capacitor 114). Thus, in the circuit of FIG. 8, internal node 105 of one shot circuit 100 is EMI sensitive, being held at a logic "1", and a PMOS transistor (not shown) of NAND gate 104 has a relatively slow charging rate compared to the ramp rate Of $V_{DD}$. This EMI sensitivity of internal node 105 means that false logic signals attributable to EMI can be propagated via the sensitive node to produce system errors. The second approach is to eliminate the EMI sensitivity by forcing the internal nodes, 105 and 111 in circuit 100 of FIG. 8, to a logic "0" state.

This is achieved in the redesigned one shot circuit of FIG. 9, where components similar to those of FIG. 8 are identified by like reference numbers. One-shot circuit 100' has a NAND gate 120 with first and second inputs received from the signals appearing at the input and output, respectively, of circuit 100'. The output of NAND gate 120 is coupled to a first input of a NOR gate 122, which has as its second input the set input of the overall one shot circuit. The output of NOR gate 122 is applied via internal circuit node 105 and then through inverter 124 as one input to NOR gate 108, the other input of which is from the set input.

In the modified configuration of one-shot circuit 100', then, the initial state of the circuit's output is a logic "1", which is forced by having a logic "1" at either of the two inputs of NOR gate 116, and both internal circuit nodes 105 and 111 are held at a logic "0" which makes both of them insensitive to the effects of EMI.

III. Input Filter for EMI Immunity

Figure 10:
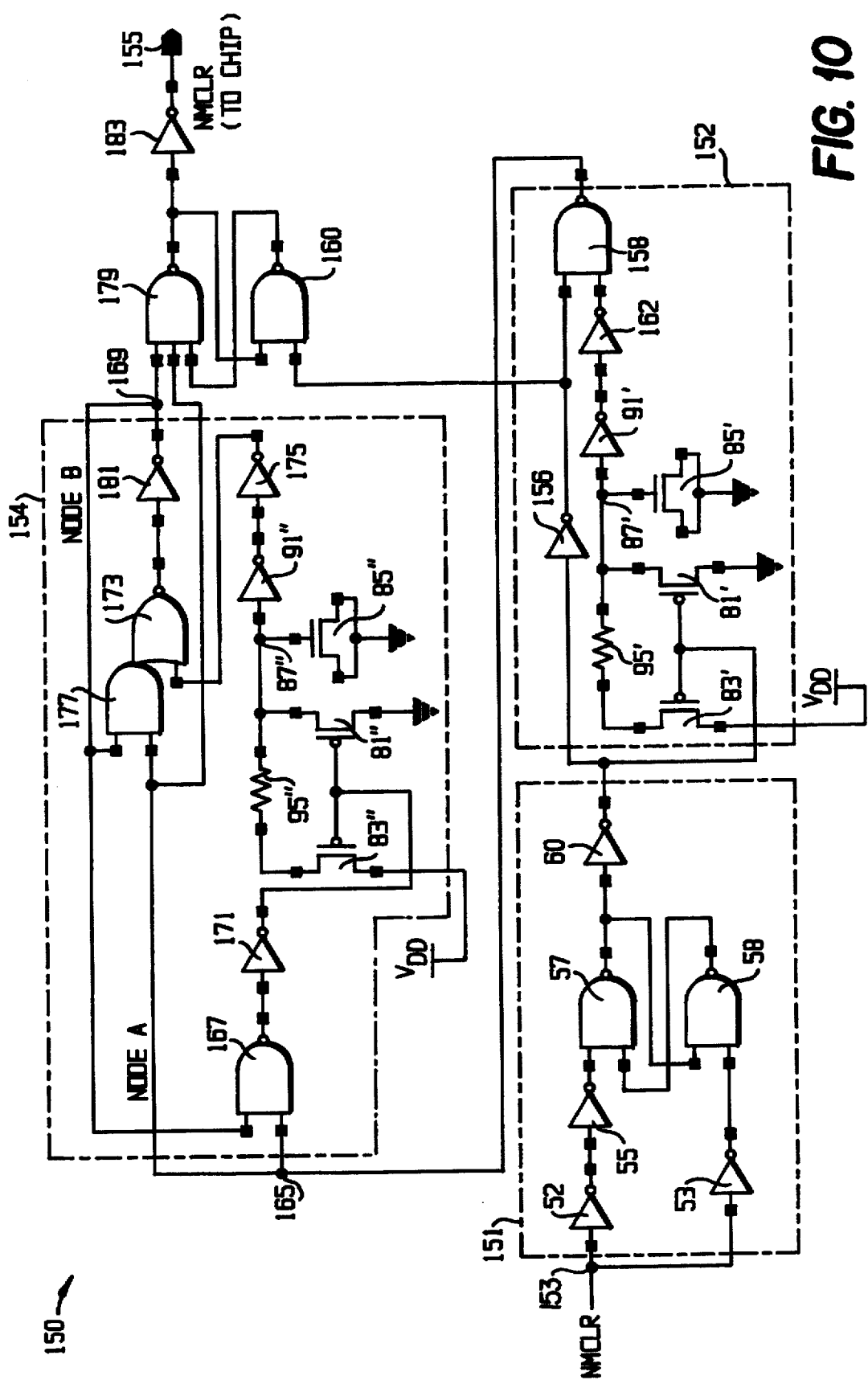
FIG. 10 is a detailed block diagram of a protection circuit of the invention which provides both input pin and internal node immunity to electromagnetic interference.

The above described approaches of the present invention may be used to design an input filter/protection circuit which provides EMI immunity for both the input pins and the internal nodes of the IC. Referring to FIG. 10, such an input filter/protection circuit 150 has an input at a pin 153, which may, for example, receive a control signal such as a master clear (NMCLR), and generates an output at pin 155 as the now EMI-immune control signal to be supplied to internal circuitry of the IC.

Protection circuit 150 includes a Schmitt trigger 151 which provides input hysteresis, a detector/filter 152, and a pulse generator circuit 154. ST 151 is identical to ST 50 of FIG. 4, and like components of the two are identified by the same reference numbers. The output of ST 151 is applied to detector/filter circuit 152 which is implemented in substantial pan in the manner of FIG. 6, and the same reference numbers are applied to like components. It should be noted that although circuit 152 (and circuit 154, to be described) shows the exemplary use of an isolation resistor 95' as offering protection for the high capacitive mode, for the specific application in which the circuit is used with a NMCLR input the protection is preferably afforded by holding the sensitive nodes of both of circuits 152 and 154 at a logic "0". Circuit 152 adds an inverter 156 whose input is obtained from the output of ST 151 and whose output is applied as a first input to each of NAND gates 158 and 160. Inverter 91 supplies the second input of NAND gate 158 via inverter 162. The output of NAND gate 158 at node 165 is the output of detector/filter circuit 152. Circuit 152 is implemented to have a filter RC time constant that reflects the hysteresis provided by ST 151 in the manner described above in connection with reduction of the effect of an EMI event at the IC's input pin.

Pulse generator 154 includes a NAND gate 167 having a first input coupled to circuit node 165 and a second input coupled to circuit node 169 at the output of the pulse generator. The output of NAND gate 167 is coupled to an input of inverter 171 whose output is coupled to an internal node protection circuit identical to that of FIG. 6, components of which are identified by like reference numbers (with the caveat mentioned above regarding preferred implementation of the protection where used with NMCLR input). The output of inverter 91" is coupled to a first input of a NOR gate 173 via an inverter 175. An AND gate 177 has first and second inputs stemming from circuit nodes 165 and 169, and supplies its output as the second input to NOR gate 173. The latter gate provides a first input to a NAND gate 179 via an inverter 181, the NAND gate having second and third inputs received from node 165 and a NAND gate 160, respectively. The output of NAND gate 179 is applied as a second input to NAND gate 160, and also through an inverter 183 to provide the masterclear (NMCLR-active low) signal to internal circuitry of the IC chip (not shown).

Figures 11A, 11B, 11C, 11D, 11E, 11F:
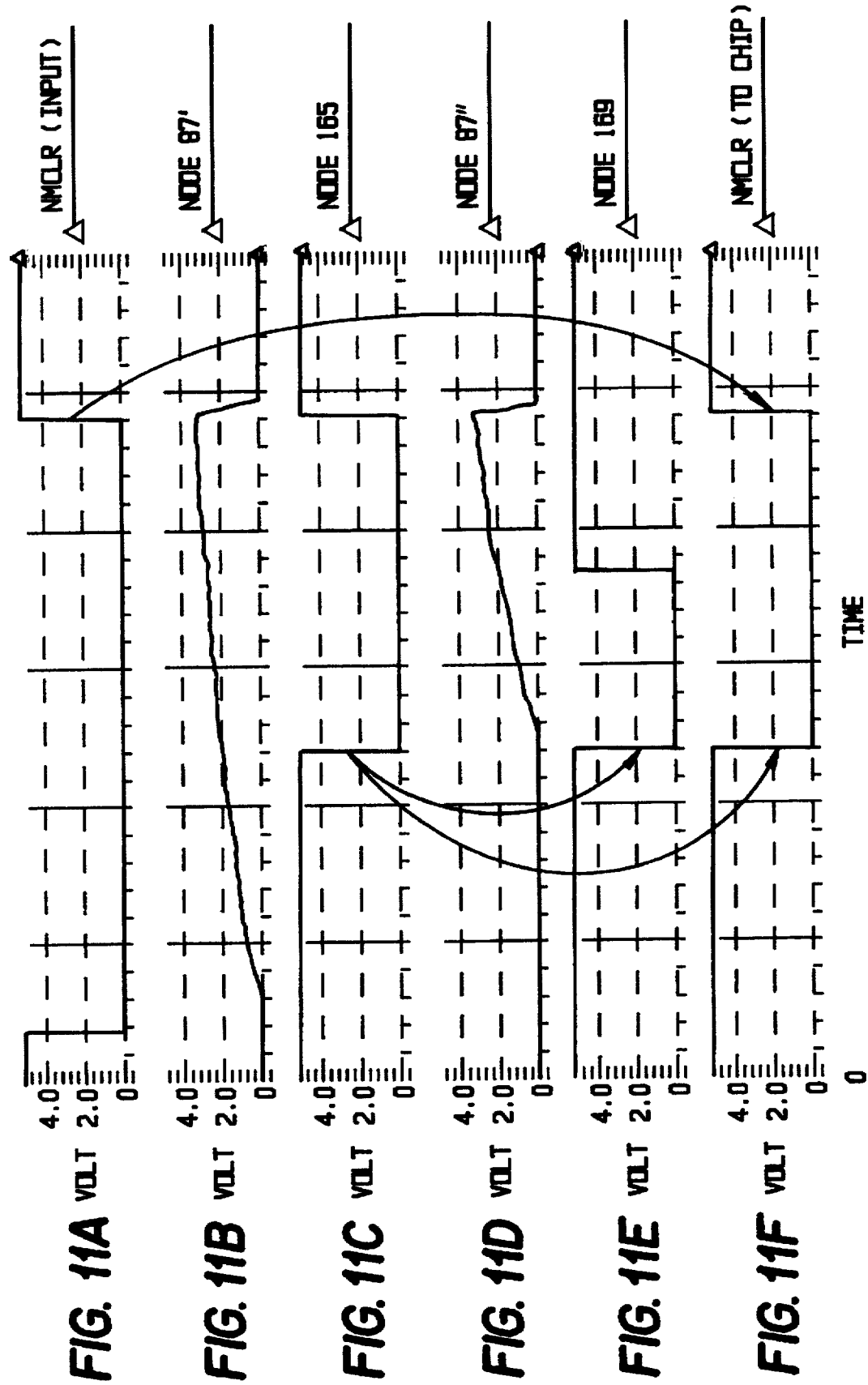
FIGS. 11A, B, C, D, E and F.

The graphs of FIGS. 11A, B, C, D, E and F illustrate signals at various identified points of protection circuit 150. FIG. 11A shows the NMCLR input signal at the input of ST 151; FIG. 11B is the signal at internal node 87'; FIG. 11C is the signal at the output of detector 152 (node 165); FIG. 11D shows the signal at internal circuit node 87"; FIG. 11E is the signal at the output of pulse generator 154 (node 169); and FIG. 11F shows the masterclear (NMCLR) signal output of protection circuit 150. As shown in FIG. 11A, the input NMCLR signal has a relatively long pulse width, and when it makes a high-to-low transition, detector/filter 152 is activated as indicated by a ramping up of the voltage at internal circuit node 87' (FIG. 11B). After a predetermined period set by the filter time constant which is selected to reject EMI at the input pin 153 (and thus, to eliminate EMI at the output pin 155 as well), based on the extent of the hysteresis effect injected by ST 151 as described earlier herein—for example, 500 nanoseconds—the detector/filter circuit times out to produce a high-to-low transition at its output (FIG. 11C).

This high-to-low transition activates pulse generator 154, trips an RS latch, and issues a chip reset (FIG. 11F), as desired since the master clear input signal stayed low for at least the predetermined filter time. The input to pulse generator circuit 154 is edge sensitive such that once tripped, it will guarantee a predetermined minimum pulse width of the masterclear signal that is applied to the chip to allow the proper execution of the command (more of the use of circuit 154 will be described presently in conjunction with the example of FIGS. 12A, B, C, D, E and F). This guards against the case in which an input pulse at pin 153 has a duration that exceeds the filtering time, where in such a case it is desired to provide a masterclear signal to the chip. In the example of FIGS. 11A, B, C, D, E and F since the input masterclear signal at pin 153 is of longer duration than the pulse generated at the output of pulse generator 154 (FIG. 11E), the masterclear signal supplied to the chip at pin 155 will remain low until the NMCLR at the input goes high again.

FIGS. 12A, B, C, D, E and F charts the signals at various points of the protection circuit 150, in the same way as in FIG. 11, except that here, the masterclear signal applied to input pin 153 of the protection circuit is slightly longer than the filter time of detector/filter 152. As a result, the output of detector 152 is a very narrow pulse (FIG. 12C) which, however, demonstrates that the masterclear input signal endured for at least the predetermined filter time set by detector 152. Hence, although quite narrow, the pulse passes through NAND gate 179 and inverter 183, causing the masterclear signal to the chip to go low (FIG. 12F), and protection circuit 150 supplies a masterclear signal to the chip as desired. But once the output of the pulse generator circuit returns high, the masterclear signal to the chip also goes high, since the signal at input 153 has long since returned to a logic high.

FIGS. 13A, B, C, D, E and F are similar to FIGS. 11A, B, C, D, E and F and FIGS. 12A, B, C, D, E and F, respectively, in respect of the various points of the protection circuit at which signals are shown, except that here, the master clear input signal (FIG. 13A) is of such short duration that detector/filter 152 completely filters the masterclear input pulse and no high-to-low transition appears at circuit node 165. Accordingly, pulse generator 154 is never triggered and no master clear signal is applied to the chip. The filter time is not shown in the Figure because it is so short that the filter never times out, in contrast to the showing of FIGS. 11A, B, C, D, E and F.

Figure 14:
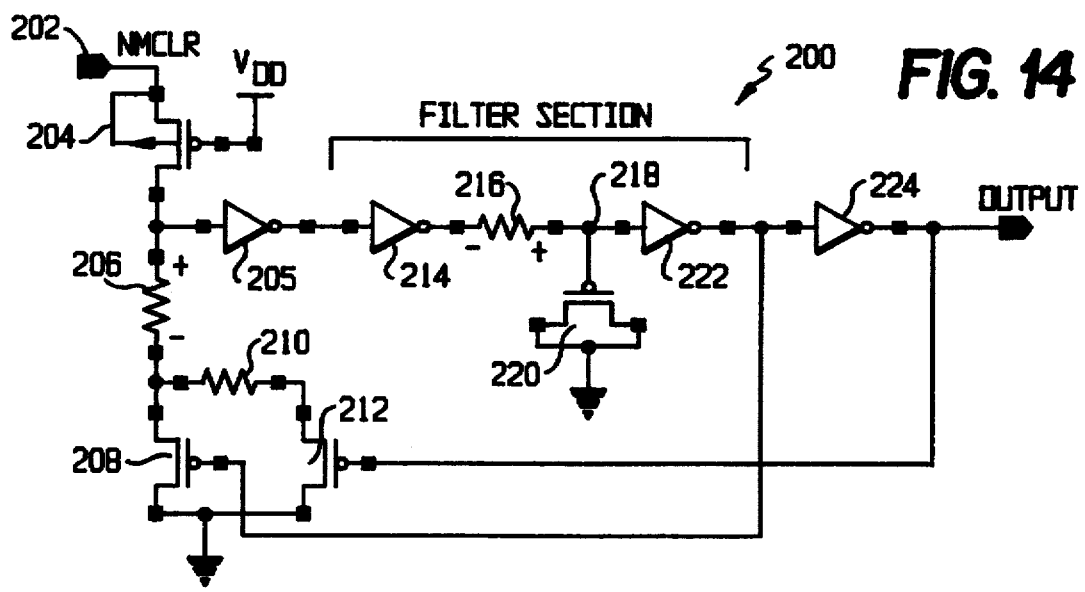
FIG. 14 is a detailed schematic diagram of an alternative input filter circuit for use in protecting an IC from electromagnetic interference.

FIG. 14 is a diagram of an alternative embodiment of an EMI protection circuit for use in conjunction with an IC. Circuit 200 includes a transistor 204 having a source coupled to input pin 202 and a gate coupled to operating potential $V_{DD}$. The drain of transistor 204 is coupled to the input of an inverter 205 and through a resistor 206 to the drain of another transistor 208. The drain of transistor 208 is also coupled through another resistor 210 to the drain of still another transistor 212. The sources of transistors 208 and 212 are returned to ground.

The output of inverter 205 is coupled through an inverter 214 and a resistor 216 to an internal circuit node 218. Node 218 is coupled through a capacitor 220 and returned to ground. Additionally, node 218 is coupled through an inverter 222 to the gate of transistor 208. Finally, the output of inverter 222 is coupled to the input of an inverter 224 whose output is the output of the overall circuit 200 and is fed back to the gate of transistor 212.

Protection circuit 200 operates in either of two modes according to the voltage applied at input pin 202. The first mode (normal mode) occurs when the input voltage applied at input pin 202 is between 0 volts and voltage $V_{DD}$. A masterclear input signal, for example, would provide such an input voltage in which 0 volts represents a logic "0" and voltage $V_{DD}$ represents a logic "1". The second mode is when the input voltage is above voltage $V_{DD}$ by a predetermined amount, such a mode potentially constituting a special mode of operation, as entry into a particular test mode. In either mode, the desire is to make the circuit immune from EMI and thereby provide a reliable output signal to the internal circuitry of the IC.

In the normal mode of operation, the voltage applied to input pin 202 is in the range from 0 volts to $V_{DD}$, and internal node 218 is at 0 volts (logic "0") and is not EMI sensitive. In the second mode, the input voltage at pin 202 is higher than $V_{DD}$—for example, 12 volts—, and circuit node 218 is held at $V_{DD}$ through a PMOS transistor (not shown) within inverter 214. In the latter situation, circuit node 218 would be sensitive to EMI but for resistor 216 acting as an isolation element between capacitor 220 and a parasitic diode associated with the PMOS pull-up transistor within inverter 214. Accordingly, protection circuit 200 provides immunity from EMI at both the input pin and internal nodes, just as circuit 154, described above. The chip is protected from the input pin by the addition of the filter section, also described above. The high voltage detector/filter provides filtering on both edges of the input pulse whereas the NMCLR filter does so on only one edge.

It will be appreciated from the foregoing disclosure that the filter time of the filter circuit—its RC time constant—assists in protecting the IC by the blocking of the circuit's response to EMI at the input. The duration matches the EMI, but is not so long that it degrades circuit operation. The hysteresis voltage is not needed to guard against spikes, but it is useful for very slow rising pulse rates. Hysteresis should be taken into account when setting filter time, because failure to so could adversely affect the circuit response.

It will be apparent to those skilled in the art from a consideration of the foregoing description that variations and modifications of the described embodiments and methods may be made without departing from the true spirit and scope of the invention. Accordingly, it is intended that the invention shall be limited only to the extent required by the appended claims and the rules and principles of applicable law.

What is claimed is:

1. A method for providing electromagnetic interference (EMI) immunity for an integrated circuit (IC), comprising the steps of:

providing an input pin of the IC for receiving an applied input signal thereat;

analyzing an input signal in presence of EMI applied to said input pin, and determining therefrom the pulse width of any false pulse present in the input signal as a consequence of EMI, including accounting for extended duration of the false pulse attributable to IC-induced hysteresis; and filtering an EMI-induced false pulse in the input signal with a filter having predetermined characteristics including a filter time constant having a duration at least as great as width of said EMI-induced false pulse.

2. The method of claim 1 further including the step of changing a logic state of EMI-sensitive internal nodes of the IC which have relatively high RC time constants, are at a logic "1" state, and are in signal paths of the IC which determine operation of the IC, from the logic "1" state to a logic "0" state during times when said EMI-sensitive internal nodes would otherwise propagate EMI-induced false pulses.

3. The method of claim 1 further including the step of electrically isolating EMI-sensitive internal nodes of the IC to thereby inhibit said internal nodes from discharging in the presence of EMI applied to said input pin.

4. The method of claim 3 wherein the step of electrically isolating includes the step of inserting a resistor between an internal node to be provided with EMI immunity and an associated pull-up device.

5. The method of claim 3 wherein the step of electrically isolating includes the step of inserting a diode between an integral node to be provided with EMI immunity and an associated pull-up device.

6. The method of claim 1 wherein said IC has integral nodes which are EMI sensitive in that each of said EMI-sensitive internal nodes has a relatively high RC time constant for charging thereof to a predetermined voltage level representing a binary logic value, and each is located in a signal path of the IC which is enabled by IC circuit conditions to determine IC operation, and each is normally held at a logic "1" value during IC operation, and further including the steps of detecting EMI in the IC, and changing the logic value of each of said EMI-sensitive internal nodes from a logic "1" value to a logic "0" value and holding the respective EMI-sensitive internal node at said logic "0" value whenever EMI is detected in said IC.

7. A circuit for providing protection from effects of electromagnetic interference (EMI) at input pins and internal nodes of an integrated circuit (IC), comprising:

regenerative comparator circuit means, coupled to an input pin of the IC, for performing triggering functions in response to input pulses applied to said input pin, resulting in hysteresis between high and low trigger voltages, said hysteresis tending to extend durations of false pulses induced by presence of EMI at the input pin; and filter means, coupled to said regenerative comparator circuit means, having predetermined characteristics including a filter time constant with a duration at least as great as an expected largest duration of EMI-induced false pulses including extended duration attributable to said hysteresis, for filtering out said EMI-induced false pulses.

8. The circuit according to claim 7, further including pulse generator means, coupled to said filter means, for generating a pulse for application to said IC whenever a pulse applied to said input pin has a duration exceeding the duration of said filter time constant.

9. The circuit according to claim 7, further including state-changing means for changing a logic state of EMI-sensitive internal nodes of the IC which have relatively high RC time constants, are at a logic "1" state, and are in signal paths of the IC which determine operation of the IC, from the logic "1" state to a logic "0" state whenever EMI is present in said IC.

10. The circuit according to claim 7, further including means coupled to EMI-sensitive internal nodes of the IC for electrically isolating said internal nodes to thereby inhibit said internal nodes from discharging in the presence of EMI in said IC.

11. The circuit according to claim 10 wherein said means for electrically isolating includes a resistor coupled between an internal node to be provided with EMI immunity and an associated pull-up device.

12. The circuit according to claim 10 wherein said means for electrically isolating includes a diode coupled between an integral node to be provided with EMI immunity and an associated pull-up device.

13. The circuit according to claim 8 wherein said IC has internal nodes which are EMI sensitive in that each of said EMI-sensitive integral nodes has a relatively high RC time constant for charging thereof to a predetermined voltage level representing a binary logic value, and each is located in a signal path of the IC which is enabled by IC circuit conditions to determine IC operation, and each is normally held at a logic "1" value during IC operation; said circuit further including means for detecting EMI in the IC, and means for changing the logic value of each of said EMI-sensitive internal nodes from a logic "1" value to a logic "0" value and holding the respective EMI-sensitive internal node at said logic "0" value whenever EMI is detected in said IC.

14. A protection circuit coupled between an input pin and internal circuitry of an integrated circuit (IC) for protecting the IC from the effects of electromagnetic interference (EMI), the input pin for receiving an input signal and the protection circuitry for providing an output signal to the internal circuitry of the IC indicative of the input signal substantially excluding the effects of EMI, the protection circuit comprising:

means for filtering pulses occurring on the input pin that are less than a predetermined duration; and means for referencing internal nodes of the protection circuit to a predetermined logic state during an EMI event to eliminate sensitivity of the internal nodes to EMI.

15. The protection circuit of claim 14 further including means inducing hysteresis effects on said input signal to extend durations of false pulses on said input pin attributable to effects of EMI, and wherein said means for filtering has a filter response time with a duration at least equal to the maximum extended durations of false pulses caused by said hysteresis effects, whereby to filter out the false pulses before application of said input signal to the internal circuitry of the IC.

16. A circuit for protecting an integrated circuit (IC) from electromagnetic interference (EMI) so as to avoid an inappropriate response by the IC to a false pulse induced at an input pin of the IC by an EMI event, the protection circuit comprising pulse width analyzer means coupled to the input pin and to internal circuitry of the IC for determining the duration of such a false pulse induced at said input pin, and filter means coupled to said pulse width analyzer means and responsive to a determination of duration of each such false pulse by said pulse analyzer means for setting response time of the filter means in accordance therewith to filter out the respective such false pulse before said internal circuitry of the IC can respond thereto, and further including electrical discharge means coupled to an internal node of the IC and responsive to occurrence of an EMI event for inhibiting discharge of the internal node upon said occurrence.

17. The protection circuit of claim 16, wherein said electrical discharge means comprises a passive electrical isolation element, a pull-up device, and electrical interconnecting means for connecting said passive electrical isolation element between said internal node and said pull-up device to enable the inhibition of discharge.

18. The protection circuit of claim 16, wherein said electrical discharge means is adapted to inhibit said discharge by holding the logic level of said internal node at "0".

\* \* \* \* \*